US008969838B2

(12) United States Patent
Vaschenko et al.

(10) Patent No.: US 8,969,838 B2
(45) Date of Patent: Mar. 3, 2015

(54) SYSTEMS AND METHODS FOR PROTECTING AN EUV LIGHT SOURCE CHAMBER FROM HIGH PRESSURE SOURCE MATERIAL LEAKS

(75) Inventors: Georgiy O. Vaschenko, San Diego, CA (US); Krishna Ramadurai, San Jose, CA (US); Richard Charles Taddiken, Santee, CA (US)

(73) Assignee: ASML Netherlands B.V., Veldhoven (NL)

( * ) Notice: Subject to any disclaimer, the term of this patent is extended or adjusted under 35 U.S.C. 154(b) by 1086 days.

(21) Appl. No.: 12/460,762

(22) Filed: Jul. 23, 2009

(65) Prior Publication Data

US 2010/0258747 A1    Oct. 14, 2010

Related U.S. Application Data

(60) Provisional application No. 61/212,285, filed on Apr. 9, 2009.

(51) Int. Cl.
G21K 5/04    (2006.01)
G05D 7/06    (2006.01)
G03F 7/20    (2006.01)
H05G 2/00    (2006.01)

(52) U.S. Cl.
CPC .......... *G05D 7/0635* (2013.01); *G03F 7/70033* (2013.01); *G03F 7/70483* (2013.01); *G03F 7/70825* (2013.01); *G03F 7/7085* (2013.01); *H05G 2/003* (2013.01); *H05G 2/005* (2013.01); *H05G 2/006* (2013.01)
USPC ............... 250/504 R; 250/493.1; 315/111.01; 315/111.21; 315/111.71; 313/231.01; 313/231.31

(58) Field of Classification Search
USPC ......... 250/493.1, 504 R; 315/111.01, 111.21, 315/111.71; 313/231.01, 231.31
See application file for complete search history.

(56) References Cited

U.S. PATENT DOCUMENTS

| 6,264,836 | B1 | 7/2001 | Lantis ........................... 210/188 |
| 6,549,551 | B2 | 4/2003 | Ness et al. ................. 372/38.07 |
| 6,567,450 | B2 | 5/2003 | Myers et al. .................... 372/55 |
| 6,625,191 | B2 | 9/2003 | Knowles et al. ................. 372/55 |
| 7,372,056 | B2 | 5/2008 | Bykanov et al. .......... 250/504 R |
| 7,405,416 | B2 | 7/2008 | Algots et al. ............... 250/493.1 |
| 7,439,530 | B2 | 10/2008 | Ershov et al. ............. 250/504 R |
| 7,449,703 | B2 | 11/2008 | Bykanov .................. 250/504 R |
| 7,465,946 | B2 | 12/2008 | Bowering et al. ......... 250/504 R |
| 7,491,954 | B2 | 2/2009 | Bykanov et al. .......... 250/504 R |
| 2005/0199294 | A1* | 9/2005 | Vaitses .......................... 137/587 |
| 2006/0192155 | A1* | 8/2006 | Algots et al. ............. 250/504 R |

(Continued)

OTHER PUBLICATIONS

U.S. Patent Application Publication No. US 2009/0014668 A1, Published on Jan. 15, 2009, Vaschenko, "Laser Produced Plasma EUV Light Source Having a Droplet Stream Produced Using a Modulated Disturbance Wave,".

(Continued)

*Primary Examiner* — Nicole Ippolito

(57) ABSTRACT

A device is described herein which may comprise a chamber, a fluid line, a pressurized source material in the fluid line, a component restricting flow of the source material into the chamber, a sensor measuring flow of a fluid in the fluid line and providing a signal indicative thereof, and a pressure relief valve responsive to a signal to reduce a leak of source material into the chamber in the event of a failure of the component.

20 Claims, 2 Drawing Sheets

(56) References Cited

U.S. PATENT DOCUMENTS

| | | | |
|---|---|---|---|
| 2006/0255298 A1 | 11/2006 | Bykanov et al. | 250/504 R |
| 2008/0043321 A1 | 2/2008 | Bowering et al. | 359/359 |
| 2008/0258085 A1* | 10/2008 | Bauer | 250/504 R |
| 2009/0032740 A1* | 2/2009 | Smith et al. | 250/503.1 |
| 2009/0230326 A1 | 9/2009 | Vaschenko et al. | 250/492.2 |

OTHER PUBLICATIONS

U.S. Patent Application Publication No. US 2009/0032740 A1, Published on Feb. 5, 2009, Smith et al., "Laser-Driven Light Source,".

PCT Search Report dated May 21, 2010, International Patent Application No. PCT/US10/029232 filed Mar. 30, 2010 (7 pages).

* cited by examiner

SYSTEMS AND METHODS FOR PROTECTING AN EUV LIGHT SOURCE CHAMBER FROM HIGH PRESSURE SOURCE MATERIAL LEAKS

FIELD

The present disclosure relates to extreme ultraviolet ("EUV") light sources that provide EUV light from a plasma that is created from a target material and collected and directed to an intermediate region for utilization outside of the EUV light source chamber, e.g., by a lithography scanner/stepper.

BACKGROUND

Extreme ultraviolet light, e.g., electromagnetic radiation having wavelengths of around 50 nm or less (also sometimes referred to as soft x-rays), and including light at a wavelength of about 13.5 nm, can be used in photolithography processes to produce extremely small features in substrates, e.g., silicon wafers.

Methods to produce a directed EUV light beam include, but are not necessarily limited to, converting a source material into a plasma state that has at least one element, e.g., xenon, lithium or tin, with one or more emission lines in the EUV range. In one such method, often termed laser-produced-plasma ("LPP"), the required plasma can be produced by irradiating a target material having the required line-emitting element, with a laser beam.

One particular LPP technique involves generating a stream of source material droplets and irradiating some or all of the droplets with laser light pulses, e.g., zero, one or more pre-pulse(s) followed by a main pulse. In more theoretical terms, LPP light sources generate EUV radiation by depositing laser energy into a source material having at least one EUV emitting element, creating a highly ionized plasma with electron temperatures of several 10's of eV. The energetic radiation generated during de-excitation and recombination of these ions is emitted from the plasma in all directions. In one common arrangement, a near-normal-incidence mirror (often termed a "collector mirror") is positioned at a relatively short distance, e.g., 10-50 cm, from the plasma to collect, direct (and in some arrangements, focus) the light to an intermediate location, e.g., a focal spot. The collected light may then be relayed from the intermediate location to a set of scanner optics and ultimately used to illuminate a resist-coated wafer. To efficiently reflect EUV light at near normal incidence, a mirror having a delicate and relatively expensive multi-layer coating is typically employed. Keeping the surface of the collector mirror clean and protecting the surface from plasma-generated debris has been one of the major challenges facing the EUV light source developers.

In quantitative terms, one arrangement that is currently being developed with the goal of producing about 100 W of EUV light at an intermediate location contemplates the use of a pulsed, focused 10-12 kW $CO_2$ drive laser which is synchronized with a droplet generator to sequentially irradiate about 10,000-200,000 tin droplets per second. For this purpose, there is a need to produce a stable stream of relatively small droplets (e.g., 5-100 μm in diameter) at a relatively high repetition rate (e.g., 10-200 kHz or more) and deliver the droplets to an irradiation site with high accuracy and good repeatability in terms of timing and position over relatively long periods of time.

In this regard, U.S. patent application Ser. No. 12/214,736, filed on Jun. 19, 2008, entitled SYSTEMS AND METHODS FOR TARGET MATERIAL DELIVERY IN A LASER PRODUCED PLASMA EUV LIGHT SOURCE, discloses a droplet generating system in which a pusher gas forces a source material, e.g., molten tin, to flow from a reservoir under pressure through a glass capillary tube which has a relatively small diameter and a length of about 10 to 50 mm. As described therein, an electro-actuatable element such as a piezoelectric actuator may be coupled to the capillary tube to disturb the fluid flowing through the tube and create a stream of droplets. In this manner, the capillary tube acts as a restriction to the flow of source material into the plasma chamber. Unfortunately, the fragile glass capillary tubes are prone to failure, generally either by fracture, or in some cases, the high pressure may cause the capillary tube to be pushed out of its fitting (i.e., the joint where the capillary attaches to a metal reservoir. When this happens, a large amount of pressurized droplet material may be sprayed into the EUV light source vacuum chamber through the large opening that develops as a result of the failure. For example, if a 1 mm diameter hole were to develop, a 0.5 L source material reservoir holding liquid tin that is maintained at 1000 psi pressure could be emptied in as few as 18 seconds. Such an event may result in substantial contamination and damage to the EUV light collecting mirror, vacuum hardware, and/or the chamber's in-vacuum diagnostic devices. Furthermore, once the reservoir holding the source material, e.g. tin, is emptied, the vacuum chamber may be pressurized by the pusher gas and this pressurization may damage the chamber's vacuum pumps.

With the above in mind, applicants disclose systems for protecting an EUV light source chamber from high pressure source material leaks and corresponding methods of use.

SUMMARY

In one aspect of the present disclosure, a device is described herein which may comprise a chamber, a fluid line, a pressurized source material in the fluid line, a component restricting flow of the source material into the chamber, a sensor measuring flow of a fluid in the fluid line and providing a signal indicative thereof, and a pressure relief valve responsive to a signal to reduce a leak of source material into the chamber in the event of a failure of the component.

In one embodiment of this aspect, the component may be a droplet nozzle and in a specific embodiment, the droplet nozzle may comprise a glass capillary tube.

In one arrangement, the source material may be pressurized by a gas and the sensor may measure flow of the gas.

In one setup, the source material may comprise liquid tin.

In one implementation, a laser system may be provided for irradiating the source material in the chamber to create an EUV light emitting plasma.

In a particular embodiment of this aspect, the source material may be pressurized by a gas, and the pressure relief valve may operate on the gas.

In some embodiments, the device may include a control circuit processing the signal from the sensor and providing a control signal to the pressure relief valve.

In one arrangement, the pressure relief valve may direct fluid from the fluid line to a second fluid line and the device may further comprise a vacuum pump connected to the second fluid line.

In one particular arrangement, the device may comprise a valve operable on the second fluid line to direct flow between a first portion of the second fluid line outputting flow to a surrounding atmosphere and a second portion of the second fluid line, the second portion connected to a vacuum pump.

In another aspect, a device is disclosed herein which may comprise a chamber, a fluid line, means for pressurizing a source material in the fluid line, means for restricting flow of the source material into the chamber, and means for reducing pressure in the fluid line to reduce a leak of source material into the chamber in the event of a failure of the restricting means.

In one embodiment of this aspect, the component may be a droplet nozzle having a glass capillary tube.

For this aspect, the source material may be pressurized by a gas and the pressure reducing means may measure the flow of the gas.

In one embodiment, the device may include a laser system for irradiating the source material in the chamber to create an EUV light emitting plasma.

In one implementation, the source material may be pressurized by a gas and the pressure reducing means may operate on the gas.

In a particular implementation, the pressure reducing means may comprise a means for measuring a flow in the fluid line and producing a signal indicative thereof, a means for processing the signal and providing a control signal, and a valve actuable by the control signal.

In another aspect, a method is disclosed herein which may comprise the acts of providing a chamber and a fluid line, pressurizing a source material in the fluid line, using a component to restrict flow of the source material into the chamber, measuring flow of a fluid in the fluid line and providing a signal indicative thereof, and reducing pressure in the fluid line in response to a signal to reduce a leak of source material into the chamber in the event of a failure of the component.

In one embodiment of this aspect, the component may be a glass capillary tube.

For this aspect, the source material may be pressurized by a gas and the measuring step may measure the flow of the gas.

In a particular embodiment, the source material may comprise liquid tin. In one implementation, the method may further comprise the step of irradiating the source material with a laser beam in the chamber to create an EUV light emitting plasma.

In one implementation, the method may further comprise the steps of electronically processing the signal from the sensor, and providing a control signal to the pressure relief valve.

DETAILED DESCRIPTION

Figure 1:
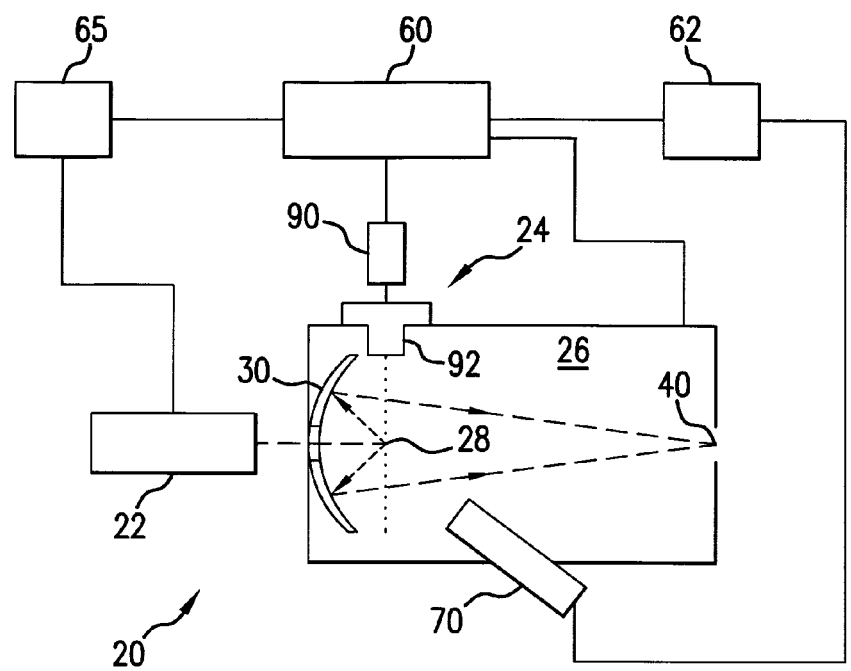
FIG. 1 shows a simplified, schematic view of a laser produced plasma EUV light source.

With initial reference to FIG. 1, there is shown a schematic view of an EUV light source, e.g., a laser-produced-plasma EUV light source 20, according to one aspect of an embodiment. As shown in FIG. 1, and described in further detail below, the LPP light source 20 may include a system 22 for generating a train of light pulses and delivering the light pulses into a chamber 26. Also detailed below, each light pulse may travel along a beam path from the system 22 and into the chamber 26, to illuminate a respective source material droplet at an irradiation region 28.

Suitable lasers for use in the system 22 shown in FIG. 1, may include, but are not necessarily limited to, a pulsed laser device, e.g., a pulsed gas discharge $CO_2$ laser device producing radiation at 9.3 μm or 10.6 μm, e.g., with DC or RF excitation, operating at relatively high power, e.g., 10 kW or higher and high pulse repetition rate, e.g., 50 kHz or more. In one particular implementation, the laser may be an axial-flow RF-pumped $CO_2$ laser having a MOPA configuration with multiple stages of amplification and having a seed pulse that is initiated by a Q-switched Master Oscillator (MO) with low energy and high repetition rate, e.g., capable of 100 kHz operation. From the MO, the seed pulse may be amplified, shaped, and focused before reaching the irradiation region 28. For example, a suitable $CO_2$ laser device having an oscillator and three amplifiers (O-PA1-PA2-PA3 configuration) is disclosed in co-pending U.S. patent application Ser. No. 11/174, 299 filed on Jun. 29, 2005, entitled, LPP EUV LIGHT SOURCE DRIVE LASER SYSTEM, the entire contents of which are hereby incorporated by reference herein. Alternatively, the laser may be configured as a so-called "self-targeting" laser system in which the droplet serves as one mirror of the optical cavity. In some "self-targeting" arrangements, a master oscillator may not be required. Self-targeting laser systems are disclosed and claimed in co-pending U.S. patent application Ser. No. 11/580,414 filed on Oct. 13, 2006, entitled, DRIVE LASER DELIVERY SYSTEMS FOR EUV LIGHT SOURCE, the entire contents of which are hereby incorporated by reference herein.

Depending on the application, other types of lasers may also be suitable, e.g., an excimer or molecular fluorine laser operating at high power and high pulse repetition rate. Other examples include, a solid state laser, e.g., having a fiber, rod or disk shaped active media, a MOPA configured excimer laser system, e.g., as shown in U.S. Pat. Nos. 6,625,191, 6,549,551, and 6,567,450, the entire contents of which are hereby incorporated by reference herein, an excimer laser having one or more chambers, e.g., an oscillator chamber and one or more amplifying chambers (with the amplifying chambers in parallel or in series), a master oscillator/power oscillator (MOPO) arrangement, a master oscillator/power ring amplifier (MOPRA) arrangement, a power oscillator/power amplifier (POPA) arrangement, or a solid state laser that seeds one or more excimer or molecular fluorine amplifier or oscillator chambers, may be suitable. Other designs are possible.

As further shown in FIG. 1, the EUV light source 20 may also include a target material delivery system 24, e.g., delivering droplets of a target material into the interior of a chamber 26 to the irradiation region 28, where the droplets will interact with one or more light pulses, e.g., one or more pre-pulses, and thereafter, one or more main pulses, to ultimately produce a plasma and generate an EUV emission. The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV light source is provided in co-pending U.S. patent application Ser. No. 11/406,216, filed on Apr. 17, 2006, entitled ALTERNATIVE FUELS FOR EUV LIGHT SOURCE, the contents of which are hereby incorporated by reference herein.

Continuing with FIG. 1, the EUV light source 20 may also include an optic 30, e.g., a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers. FIG. 1 shows that the optic 30 may be formed with an aperture to allow the light pulses generated by the system 22 to pass through and reach the irradiation region 28. As shown, the optic 30 may be, e.g., a prolate spheroid mirror that has a first focus within or near the irradiation region 28, and a second focus at a so-called intermediate region 40, where the EUV light may be output from the EUV light source 20 and input to a device utilizing EUV light, e.g., an integrated circuit lithography tool (not shown). It is to be appreciated that other optics may be used in place of the prolate spheroid mirror for collecting and directing light to an intermediate location for subsequent delivery to a device utilizing EUV light, for example, the optic may be a parabola rotated about its major axis, or may be configured to deliver a beam having a ring-shaped cross-section to an intermediate location, see e.g., co-pending U.S. patent application Ser. No. 11/505,177, filed on Aug. 16, 2006, entitled EUV OPTICS, the contents of which are hereby incorporated by reference.

Continuing with reference to FIG. 1, the EUV light source 20 may also include an EUV controller 60, which may also include a firing control system 65 for triggering one or more lamps and/or laser devices in the system 22 to thereby generate light pulses for delivery into the chamber 26. The EUV light source 20 may also include a droplet position detection system which may include one or more droplet imagers 70 e.g., system(s) for capturing images using CCD's and/or backlight stroboscopic illumination and/or light curtains that provide an output indicative of the position and/or timing of one or more droplets, e.g., relative to the irradiation region 28. The imager(s) 70 may provide this output to a droplet position detection feedback system 62, which can, e.g., compute a droplet position and trajectory, from which a droplet error can be computed, e.g., on a droplet-by-droplet basis, or on average. The droplet position error may then be provided as an input to the controller 60, which can, for example, provide a position, direction and/or timing correction signal to the system 22 to control a source timing circuit and/or to control a beam position and shaping system, e.g., to change the trajectory and/or focal power of the light pulses being delivered to the irradiation region 28 in the chamber 26.

The EUV light source 20 may include one or more EUV metrology instruments for measuring various properties of the EUV light generated by the source 20. These properties may include, for example, intensity (e.g., total intensity or intensity within a particular spectral band), spectral bandwidth, polarization, beam position, pointing, etc. For the EUV light source 20, the instrument(s) may be configured to operate while the downstream tool, e.g., photolithography scanner, is on-line, e.g., by sampling a portion of the EUV output, e.g., using a pick-off mirror or sampling "uncollected" EUV light, and/or may operate while the downstream tool, e.g., photolithography scanner, is off-line, for example, by measuring the entire EUV output of the EUV light source 20.

As further shown in FIG. 1, the EUV light source 20 may include a droplet control system 90, operable in response to a signal (which in some implementations may include the droplet error described above, or some quantity derived therefrom) from the controller 60, to e.g., modify the release point of the target material from a source material delivery system 92 and/or modify droplet formation timing, to correct for errors in the droplets arriving at the desired irradiation region 28 and/or synchronize the generation of droplets with the pulsed laser system 22.

Figure 2:
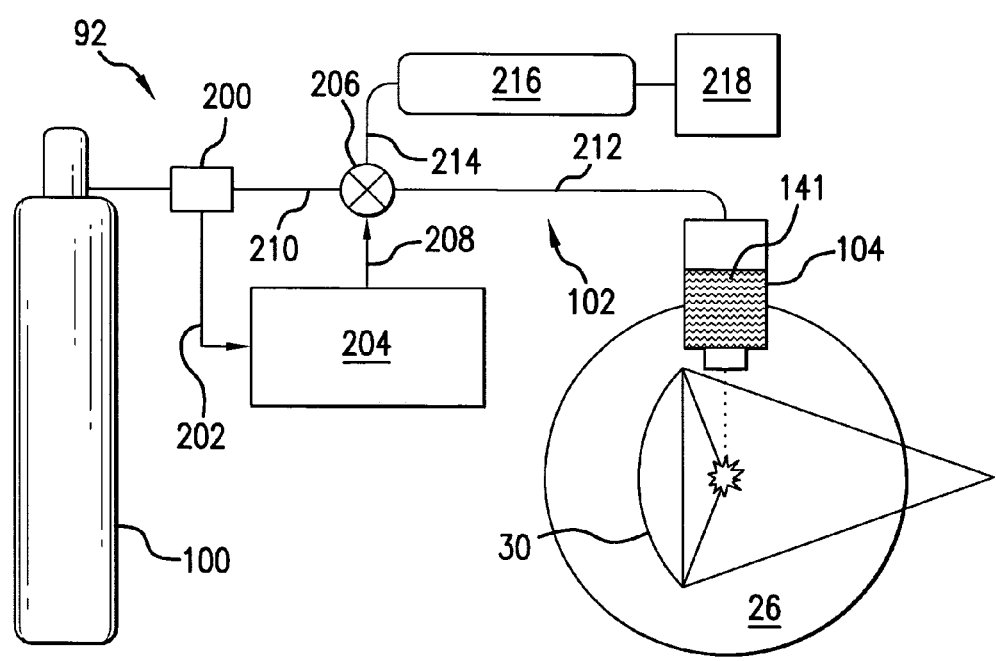
FIG. 2 shows a schematic view of a system for protecting an EUV light source chamber from high pressure source material leaks.

FIG. 2 illustrates in schematic format an embodiment of a source material delivery system 92 having a gas cylinder 100 for containing and delivering a regulated supply of pusher gas in the fluid line 102. As shown, the pusher gas forces a source material such as liquid tin into chamber 26 via source material dispenser 104.

Figure 3:
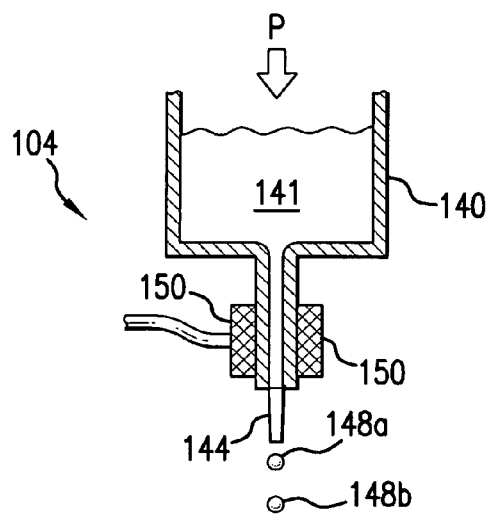
FIG. 3 shows a sectional view illustrating a droplet generator having an electro-actuatable element creating a disturbance in a fluid stream which subsequently exits through an orifice.

FIG. 3 shows one example of a source material dispenser 104 for use in the source material delivery system 92 shown in FIG. 2. As shown in FIG. 3, source material dispenser 104 may include a reservoir 140 holding a fluid 141, e.g., source material such as molten tin, under pressure, P, established by the pusher gas. Also shown, the reservoir 140 may be operably attached to a conduit, e.g. a droplet nozzle such as glass capillary tube 144 e.g., made of a silica-based glass such as borosilicate glass or quartz, and having a shaped exit orifice nozzle. With this arrangement, the capillary tube 144 acts as restrictor, restricting flow of the source material into the chamber 26 (see FIG. 2).

Figure 4:
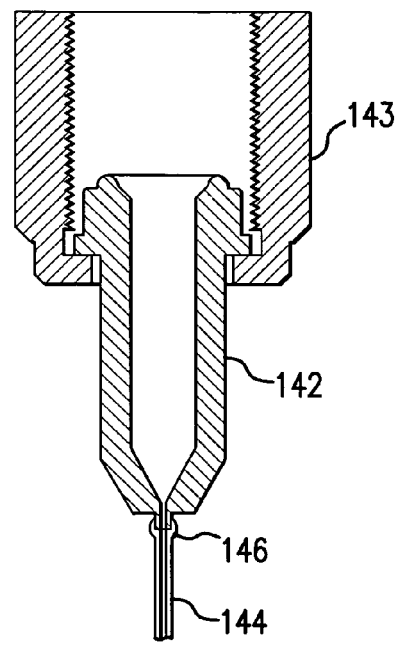
FIG. 4 shows a sectional, detailed view of a portion of a droplet generator for an EUV light source having a glass capillary tube attached to a metal source material conduit.

FIG. 4 illustrates one example of an arrangement for coupling a glass portion, e.g., a glass capillary tube 144 with a metal nut 143 which can then be threaded onto metal reservoir 140 shown in FIG. 3. As shown in FIG. 4, the coupling may include a sealing joint 146 consisting of a joining metal coupling the glass portion and a metallic portion 142 which can then be coupled to nut 143.

Additional examples of other arrangements for coupling a glass portion, e.g., a glass capillary tube, and an open face seal, e.g., VCR seal component, may be found in co-pending U.S. patent application Ser. No. 12/214,736, filed on Jun. 19, 2008, entitled SYSTEMS AND METHODS FOR TARGET MATERIAL DELIVERY IN A LASER PRODUCED PLASMA EUV LIGHT SOURCE, discussed above.

With reference now to FIG. 3, the source material dispenser 104 may further include a sub-system producing a disturbance in the fluid 141 having an electro-actuatable element 150 that is operably coupled with the fluid 141, and a signal generator (not shown) driving the electro-actuatable element 150. As shown, an electro-actuatable element 150, e.g., having a ring-like or tube-like shape, may be positioned around the tube 144. When driven, the electro-actuatable element 142 may selectively squeeze the tube 144 to disturb the stream of fluid 141 producing a stream of droplets 148a,b. It is to be appreciated that two or more electro-actuatable elements may be employed to selectively squeeze the conduit 142 at respective frequencies.

More details regarding various droplet dispenser configurations and their relative advantages may be found in co-pending U.S. patent application Ser. No. 12/214,736, filed on Jun. 19, 2008, entitled SYSTEMS AND METHODS FOR TARGET MATERIAL DELIVERY IN A LASER PRO- DUCED PLASMA EUV LIGHT SOURCE; co-pending U.S. patent application Ser. No. 11/827,803, filed on Jul. 13, 2007, entitled LASER PRODUCED PLASMA EUV LIGHT SOURCE HAVING A DROPLET STREAM PRODUCED USING A MODULATED DISTURBANCE WAVE; co-pending U.S. patent application Ser. No. 11/358,988, filed on Feb. 21, 2006, entitled LASER PRODUCED PLASMA EUV LIGHT SOURCE WITH PRE-PULSE; co-pending U.S. patent application Ser. No. 11/067,124, filed on Feb. 25, 2005, entitled METHOD AND APPARATUS FOR EUV PLASMA SOURCE TARGET DELIVERY; and co-pending U.S. patent application Ser. No. 11/174,443, filed on Jun. 29, 2005, entitled LPP EUV PLASMA SOURCE MATERIAL TARGET DELIVERY SYSTEM; the contents of each of which are hereby incorporated by reference.

With reference now to FIG. 2, it can be seen that the source material delivery system 92 may include a sensor 200 operable on fluid line 102 to measure a fluid parameter, such as flow rate, within fluid line 102. For the system 92, the sensor may provide a signal indicative of the parameter and output the signal over wire(s) 202 to a control circuit 204, which may be, for example, a stand-alone controller or may be integrated with one or more of the controllers described above.

FIG. 2 further shows that the system 92 may include a pressure relief valve 206 operable on the fluid line 102, and responsive to a control signal from the control circuit 204 over wire(s) 208 to reduce a leak of source material fluid 141 into the chamber 26, in the event of a failure of a component, such as the capillary tube 144 shown in FIG. 3. Specifically, valve 206 is actuable back-and-forth between a first configuration in which fluid communication is established between sub-line 210 and sub-line 212, and second fluid line 214 blocked, to a second configuration in which fluid communication is established between sub-line 212 and second fluid line 214 and sub-line 210 is blocked. As further shown in FIG. 2, a reservoir 216 and vacuum pump 218 may be operably connected to the second fluid line 214.

In the operation of the source material delivery system 92, the valve 206 is initially placed in the first configuration, allowing pusher gas to flow from sub-line 210 to sub-line 212, and thus pressurizing the source material fluid 141. Also, vacuum pump 218 is activated to establish a predetermined vacuum in reservoir 216. During droplet generation, sensor 200 monitors the fluid line 102 transmitting a signal indicative of a fluid parameter, e.g., flow rate, to the control circuit 204, which then determines whether the parameter exceeds a pre-establish threshold (which may be varied via user input), indicating that a component failure has occurred. If the parameter exceeds the pre-establish threshold, a control signal is sent to valve 206. Upon receipt of the control signal, valve 206 is actuated into the second configuration in which gas flows from sub-line 212 into second fluid line 214, and reservoir 216 releasing the pressure on source material fluid 141. Sub-line 210 is blocked to isolate gas cylinder 100.

Figure 5:
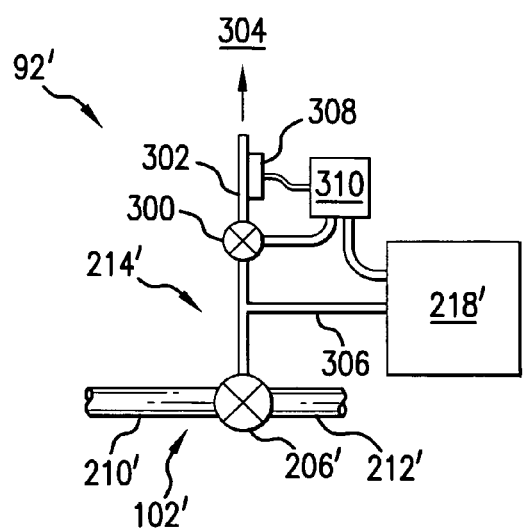
FIG. 5 shows a schematic view of another system for protecting an EUV light source chamber from high pressure source material leaks.

FIG. 5 shows portions of another embodiment of a source material delivery system 92' in which a valve 300 may be provided to operate on the second fluid line 214' to direct flow between a first portion 302 of the second fluid line 214', outputting flow to a surrounding atmosphere 304, and a second portion 306 which is connected to a vacuum pump 218'. Note, the other components of FIG. 2, e.g., gas cylinder 100, sensor 200, fluid line 102, control circuit 204 and dispenser 104 may be similarly arranged in the embodiment of FIG. 5.

In more detail, FIG. 5 shows that a flow sensor 308 may be provided to measure flow within portion 302 and output a signal indicative thereof to control circuit 310. In response thereof, control circuit 310 may then send a control signal to valve 300 and vacuum pump 218'.

In the operation of the source material delivery system 92' shown in FIG. 5, the valve 206' is initially placed in the first configuration allowing pusher gas to flow from sub-line 210' to sub-line 212', and thus pressurizing the source material fluid. Also, valve 300 is initially open. As described above for the FIG. 2 embodiment, once a leak in fluid line 102' is sensed, valve 206' is actuated into the second configuration in which gas flows from sub-line 212' into second fluid line 214'. With valve 300 open, gas initially flows through portion 302 to the surrounding atmosphere 304. Once flow is reduced in portion 302 below a pre-established amount (measured by sensor 308), a signal indicative thereof is sent to control circuit 310. In response to the signal, control circuit 310 sends control signals to close valve 300 and activate vacuum pump 218' to further reduce the pressure in portion 212' of fluid line 102'.

While the particular embodiment(s) described and illustrated in this patent application in the detail required to satisfy 35 U.S.C. §112, are fully capable of attaining one or more of the above-described purposes for, problems to be solved by, or any other reasons for, or objects of the embodiment(s) described above, it is to be understood by those skilled in the art that the above-described embodiment(s) are merely exemplary, illustrative and representative of the subject matter which is broadly contemplated by the present application. Reference to an element in the following Claims in the singular, is not intended to mean, nor shall it mean in interpreting such Claim element "one and only one" unless explicitly so stated, but rather "one or more". All structural and functional equivalents to any of the elements of the above-described embodiment(s) that are known, or later come to be known to those of ordinary skill in the art, are expressly incorporated herein by reference and are intended to be encompassed by the present Claims. Any term used in the Specification and/or in the Claims, and expressly given a meaning in the Specification and/or Claims in the present Application, shall have that meaning, regardless of any dictionary or other commonly used meaning for such a term. It is not intended or necessary for a device or method discussed in the Specification as an embodiment, to address or solve each and every problem discussed in this Application, for it to be encompassed by the present Claims. No element, component, or method step in the present disclosure is intended to be dedicated to the public regardless of whether the element, component, or method step is explicitly recited in the Claims. No claim element in the appended Claims is to be construed under the provisions of 35 U.S.C. §112, sixth paragraph, unless the element is expressly recited using the phrase "means for" or, in the case of a method claim, the element is recited as a "step" instead of an "act".

What is claimed is:

1. A device comprising:
   a chamber;
   a fluid line;
   a pressurized source material in said fluid line;
   a component restricting flow of said source material into said chamber;
   a sensor measuring flow of a fluid in said fluid line and providing a signal indicative thereof, wherein said fluid pressurizes said source material in said fluid line; and
   a pressure relief valve responsive to said signal to change a pressure that said fluid in said fluid line exerts upon said source material to reduce a leak of source material into said chamber in the event of a failure of said component.

2. A device as recited in claim 1 wherein said component is a droplet nozzle.

3. A device as recited in claim 2 wherein said droplet nozzle comprises a glass capillary tube.

4. A device as recited in claim 1 wherein said fluid is a gas.

5. A device as recited in claim 1 further comprising a laser system for irradiating said source material in said chamber to create an EUV light emitting plasma.

6. A device as recited in claim 1 further comprising an electro-actuable element coupled to said component for generating a stream of droplets from said source material.

7. A device as recited in claim 1 further comprising a control circuit processing said signal from said sensor and providing a control signal to said pressure relief valve.

8. A device as recited in claim 1 wherein said pressure relief valve directs fluid from said fluid line to a second fluid line and said device further comprises a vacuum pump connected to said second fluid line.

9. A device as recited in claim 8 comprises a valve operable on said second fluid line to direct flow between a first portion of said second fluid line outputting flow to a surrounding atmosphere and a second portion of aid second fluid line, said second portion connected to a vacuum pump.

10. A device comprising:
a chamber;
a fluid line;
means for pressurizing, using a fluid different from said a source material, said source material in said fluid line;
means for restricting flow of said source material into said chamber; and
means for reducing pressure of said fluid in said fluid line to change a pressure that said fluid in said fluid line exerts upon said source material to reduce a leak of source material into said chamber in the event of a failure of said restricting means.

11. A device as recited in claim 10 wherein said means for restricting is a droplet nozzle having a glass capillary tube.

12. A device as recited in claim 10 wherein said fluid is a gas.

13. A device as recited in claim 10 further comprising a laser system for irradiating said source material in said chamber to create an EUV light emitting plasma.

14. A device as recited in claim 10 wherein said pressure reducing means comprises a means for measuring a pressure of said fluid in said fluid line and producing a signal indicative thereof, a means for processing said signal and providing a control signal, and a valve actuable by said control signal.

15. A device as recited in claim 10 wherein said pressure reducing means comprises a means for measuring a flow of said fluid in said fluid line and producing a signal indicative thereof, a means for processing said signal and providing a control signal, and a valve actuable by said control signal.

16. A method comprising the acts of:
providing a chamber and a fluid line;
pressurizing a fluid in said fluid line to cause said fluid to pressurize a source material in said fluid line;
using a component to restrict flow of said source material into said chamber;
measuring flow of said fluid in said fluid line and providing a signal indicative thereof; and
reducing pressure in said fluid line in response to a signal to change a pressure that said fluid in said fluid line exerts upon said source material to reduce a leak of source material into said chamber in the event of a failure of said component.

17. A method as recited in claim 16 wherein said component is a glass capillary tube.

18. A method as recited in claim 16 wherein said fluid is a gas.

19. A method as recited in claim 16 further comprising the step of:
irradiating said source material with a laser beam in said chamber to create an EUV light emitting plasma.

20. A method as recited in claim 16 further comprising diverting said fluid to a low pressure environment that is created by a vacuum pump to reduce said pressure that said fluid in said fluid line exerts upon said source material.

* * * * *